United States Patent [19]

Lane et al.

[11] Patent Number: 5,145,571
[45] Date of Patent: Sep. 8, 1992

[54] GOLD INTERCONNECT WITH SIDEWALL-SPACERS

[75] Inventors: Richard H. Lane, Hillsboro; Timothy M. Ebel, Aloha, both of Oreg.

[73] Assignee: Bipolar Integrated Technology, Inc., Beaverton, Oreg.

[21] Appl. No.: 562,265

[22] Filed: Aug. 3, 1990

[51] Int. Cl.5 .................................................. C25D 5/02
[52] U.S. Cl. ..................................................... 205/123
[58] Field of Search ........................ 204/15, 37.1, 38.4

[56] References Cited

U.S. PATENT DOCUMENTS

| | | | |
|---|---|---|---|
| 4,454,014 | 6/1984 | Bischoff | 204/15 |
| 4,471,522 | 9/1984 | Jambotkar | 437/162 |
| 4,687,552 | 8/1987 | Early et al. | 204/15 |

Primary Examiner—T. M. Tufariello
Attorney, Agent, or Firm—Marger, Johnson, McCollom & Stolowitz, Inc.

[57] ABSTRACT

In an integrated circuit, gold interconnect metal lines are electroplated onto plating (Pd) and barrier (TiW) layers, using patterned photoresist. The photoresist is stripped and the plating layer portions thus exposed are etched to expose field areas of the barrier layer. Next, sidewall spacers are formed along each side of the interconnect lines. The field areas of the barrier layer are then etched to isolate the gold interconnect lines. The spacers offset the amount of undercut due to isotropic etching of the TiW barrier metal layer. After etching, the sidewall spacers serve to preserve the as-deposited profile of the gold interconnect lines against breadloafing in a subsequent annealing step.

18 Claims, 1 Drawing Sheet

GOLD INTERCONNECT WITH SIDEWALL-SPACERS

BACKGROUND OF THE INVENTION

This invention relates to metallization of integrated circuitry and more particularly to an additive metallization process in which interconnect lines are formed of a conductive metal, such as gold, over a semiconductor substrate surface with an intervening layer of a barrier metal.

Additive integrated circuit metallization processes are known to have a number of advantages over conventional substractive metallization techniques, and particularly in forming interconnects of a corrosion and oxidation resistant metal, such as gold.

A known gold IC metallization process is disclosed in U.S. Pat. No. 4,687,552 to Early et al, and references cited therein. Briefly, such a process commences by depositing a barrier metal layer, such as tungsten or a titanium tungsten (TiW), over a surface of a semiconductor substrate, followed by deposition of a thin plating layer, such as palladium. These layers may be deposited in a substantially flat layer directly onto the semiconductor substrate surface or, as shown in Early et al, over an insulative layer that has been patterned to provide contact openings in which portions of the semiconductor substrate surface are exposed. Next, a positive photoresist layer is applied and patterned to expose an area of the circuit upon which the metal interconnect is to be formed. Interconnect metal, such as gold, is then electroplated upon the exposed surface regions of the plating metal to form the metal interconnect lines. After removing the photoresist, the exposed areas of plating metal and barrier metal are etched away, using a conventional wet etch technique with the interconnect metal serving as a mask, to electrically isolate the interconnections. This forms a first-layer interconnect pattern. An insulative layer, such as silicon dioxide, can then be applied over the first-layer interconnections and the foregoing procedure can be repeated to form second layer interconnections. Third layer interconnections can be similarly formed.

The foregoing approach has a number of drawbacks. One is that the step of wet etching the plating and barrier metal layers tends to undercut the interconnect metal layers. Undercutting occurs because wet etching is essentially isotropic; thus, the barrier metal not masked by the interconnect metal is removed from a margin extending beneath the edges of the interconnect metal. Added problems include the facts that using palladium as a plating layer catalyzes the undercutting, and that, due to topographic variations, it is necessary to overetch by 20–25%. A second problem, for which Early et al describe and propose one solution, is deformation of the interconnect metal line profiles during subsequent process steps, particularly annealing. This problem is enhanced by the fact that electroplating the gold metal lines into a photoresist pattern produces a retrograde sidewall, which is accentuated by deformation due to heat treating.

Early et al approached the latter problem by deposition of a rhodium layer atop the gold interconnect layer. This approach requires the use of a second electrodeposition step, and, further, requires that the palladium layer be sputter etched, rather than wet etched, to avoid removing gold and undercutting the rhodium. Moreover, this approach does not avoid the undercutting affects of a wet TiW etch.

An alternative approach to the deformation problem is known as reverse anneal (RA). The RA approach is a modification of the conventional process wherein the metal anneal is performed before the wet etch of the field metal. In this technique, the major profile change of the metal lines during the annealling step occurs before the isotropic etch. This sequence moves the starting edge of the undercut outward to where the gold has relaxed. Unfortunately, annealling while Pd/TiW or TiW layers are still continuous between the gold metal lines leads to conductive paths or "stringers" between metal lines, apparently composed of Au+Pd material. Such stringers can cause unacceptable electrical leakage between lines and degrade the reliability of the circuit.

Accordingly, a need remains for a satisfactory additive metallization process, particularly one that is suitable for gold metallization with a barrier layer, for making conductive interconnections across a semiconductor substrate surface.

SUMMARY OF THE INVENTION

One object of the invention is to improve upon prior additive metallization processes used in fabrication of integrated circuits.

Another object of the invention is to reduce undercutting of a barrier layer beneath the metal interconnection lines.

A further object of the invention as aforementioned is to minimize deformation of interconnect line profiles, particularly when gold is used as the interconnect metallization.

The invention is an improved method of additive interconnect metallization wherein an interconnect metal line is electroplated over a barrier layer or plating and barrier layers, followed by a selective removal step to isolate the interconnect lines which includes wet etching of exposed portions of the barrier layer. In the present invention, after additively depositing the interconnect metal lines but before removal of exposed or field areas of the barrier layer (i.e., the field metal), sidewalls are formed on each side of the metal interconnect lines so as to limit lateral etching to a barrier layer margin protruding outward from the interconnect lines. The width or lateral thickness of the sidewalls is sized as to offset the amount of undercut of the barrier layer produced by wet etching the field metal. The sidewalls, hence called spacers, are preferably formed, after electroplating of the metal interconnect lines, by depositing a dielectric layer, such as chemical vapor deposited nitride, over the entire surface of the substrate and then etching this layer anisotropically, such as by reactive ion etch. After etching the field metal, the sidewall spacers are preferably left in place for subsequent processing steps, including annealing. With the spacers left in place, the profile of the gold interconnect lines remains essentially unchanged during subsequent heat cycles.

It is known to use sidewall spacers in the fabrication of silicon MOSFET devices and integrated circuits. For example, U.S. Pat. No. 4,471,522 to Jambotkar discloses the formation of spacers to define the width of a polysilicon gate formed on an oxide layer and insulate the gate structure from metal source and drain contacts to the silicon subsequently formed alongside the gate structure. Sidewall spacers have also been used to control ion implantation in MOSFET processes to make lightly-doped drain (LDD) structures. These applications are limited, however, to formation of the active devices themselves. Sidewall spacers are not known to be used on the sides of metal lines that interconnect the devices or other lines or to control etching of barrier layer after forming interconnect lines thereon, e.g., by additive deposition.

The invention has demonstrated a substantial improvement in yield and/or reliability over prior gold metallization techniques.

The foregoing and other objects, features and advantages of the invention will become more readily apparent from the following detailed description of a preferred embodiment which proceeds with reference to the accompanying drawings.

DETAILED DESCRIPTION

Figure 1:
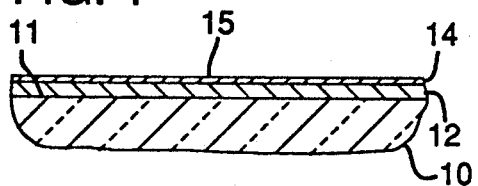
FIG. 1 is a cross-sectional view showing an intermediate stage of fabrication of an integrated circuit, preparatory to metallization in accordance with the invention.

Referring to FIG. 1, preparatory to metallization in accordance with the invention, a silicon or other suitable semiconductor substrate 10 is processed in conventional manner to form circuit elements (not shown) therein. The semiconductor surface is passivated with a suitable dielectric, commonly referred to as field oxide. As used herein, the term substrate 10 refers to the foregoing general structure. A barrier layer 12, such as tungsten or, preferably, titanium tungsten (TiW), is sputter-deposited onto the upper surface 11 of substrate 10 to a thickness of about 1500 angstroms. Then, a palladium (Pd) plating layer 14 is deposited over layer 12 to the thickness of 100-200 angstroms.

Figure 2:
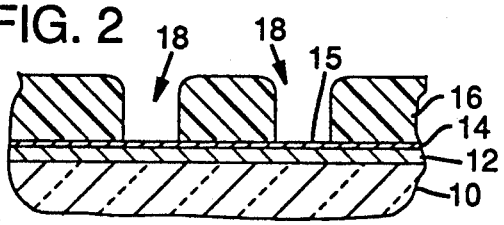
FIG. 2 shows a cross section similar to FIG. 1 following application and patterning of a layer of positive photoresist on the upper surface of the substrate.

Referring to FIG. 2, a layer of photoresist 16 (PR) is applied over the entire substrate, atop the upper surface 15 of the plating layer 14. The photoresist is masked and exposed to form a elongated narrow channel, such as openings 18, wherein the upper surface 15 of the plating layer 14 is exposed.

Figure 3:
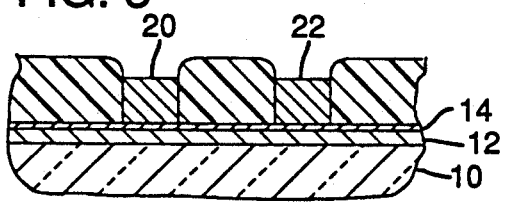
FIG. 3 is a view similar to FIG. 2 showing the step of additive metallization to form metal interconnect lines, shown in cross section, along exposed areas of the substrate surface.

Next, referring to FIG. 3, a layer of gold is electrodeposited selectively onto the surface of plating layer 14 within openings 18 to a thickness of about 10,000 angstroms. This step forms conductive metal lines 20, 22 with a slightly retrograde sidewall profile (not shown). Gold (Au) is preferred for metal interconnect lines in dense, high speed electronic circuits but other metals may be substituted.

Figure 4:
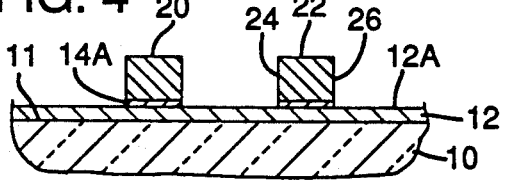
FIG. 4 is a view similar to FIG. 3 following removal of the photoresist and intermediate plating layer.

The photoresist is then stripped, exposing surface 15 of plating layer 14, which is then etched in an iodine-based etchant. This step, shown in FIG. 4, exposes the surface of the TiW barrier layer 12 as well as sidewalls 24, 26 of the metal lines and sidewalls 14A of the palladium layer. The sidewalls are ideally normal to substrate surface 11, as shown in FIG. 4, but are slightly retrograde in practice.

Figure 5:
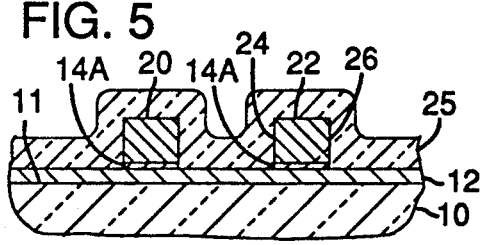
FIG. 5 is a view similar to FIG. 4 following deposition of a dielectric layer over the semiconductor surface and metal interconnect lines.

Next, referring to FIG. 5, a semi-conformal dielectric layer 25, such as silicon nitride ($Si_xN_y$) is deposited over the entire substrate surface to a thickness of about 4,000 angstroms. Layer 25 is deposited in contact with the sidewalls 24, 26 and 14A of the metal lines as well as on the upward facing horizontal top surfaces of the metal lines 20, 22 and the exposed upper surface 12A of the barrier layer. In subsequent steps, portions of layer 25 are selectively removed to form sidewall spacers 30, 32, as shown in FIG. 6 and 7.

Figure 6:
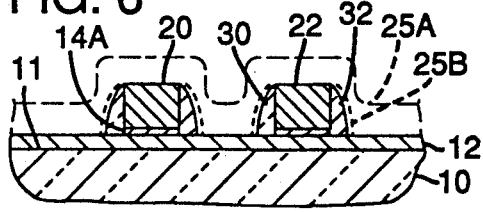
FIG. 6 is a view similar to FIG. 5 indicating the regions of the dielectric which are removed by an anisotropic etch so as to leave sidewalls along the metal interconnect lines.

First, the portion of layer 25 designated as layer 25A in FIG. 6 is removed by an anisotropic etch, herein referred to as the spacer etch. There are many suitable anisotropic etches such as, for example, that available in a Tegal 903 reactive ion oxide etcher. Sufficient etching is used to expose the top surfaces of the metal lines 20, 22 and the top surface of the barrier layer 12 in the field areas. The field areas are those regions at least 1μ outside of the edges of the metal lines 24, 26. Second, an additional margin of etching 25B, referred to here as an overetch, is used to compensate for nonuniformities of dielectric deposition and anisotropic etch. Without this overetch some portions of the wafer could have dielectric covering areas of the barrier layer 12.

Figure 7:
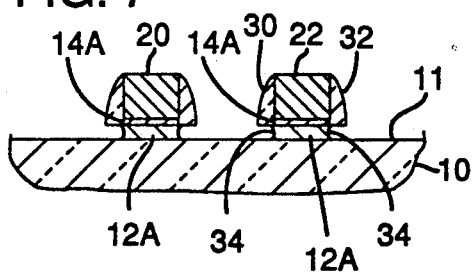
FIG. 7 is a view similar to FIG. 6 following isotropic etching of the barrier layer to laterally isolate the interconnect lines electrically from one another.

Referring to FIG. 7, the preceding etches leave behind spacers 30, 32 along all the sidewalls of the metal lines 20, 22. The spacers serve to protect from subsequent etching an underlying margin of the barrier layer 12 that extends laterally beyond both sidewalls of all of the metal lines. The lateral length of this protected margin is principally determined by the deposited thickness of layer 25 (FIG. 5) and, to a lesser extent, by the amount of overetch 25B (FIG. 5A) that is used.

As shown in FIG. 7, the barrier layer 12 is etched with hydrogen peroxide ($H_2O_2$) to expose the underlying substrate surface 11 and to laterally isolate the metal interconnect lines electrically from one another. The barrier layer is removed from all areas except where it is protected from etching by the presence of the metal lines 20, 22 and the spacers 30, 32 on the sidewalls of the metal lines. The remaining areas of barrier metal are identified by reference numeral 12A.

During the course of the etching, there is some lateral etching of the barrier layer. This causes the sidewall 34 of the barrier layer to move a distance D (FIG. 8) laterally inward from the outer edge of the spacer. By properly choosing the deposition thickness and hence the spacer width, it is possible to keep the edge of the barrier layer 34 from being etched back under the edge of the metal line.

Figure 8:
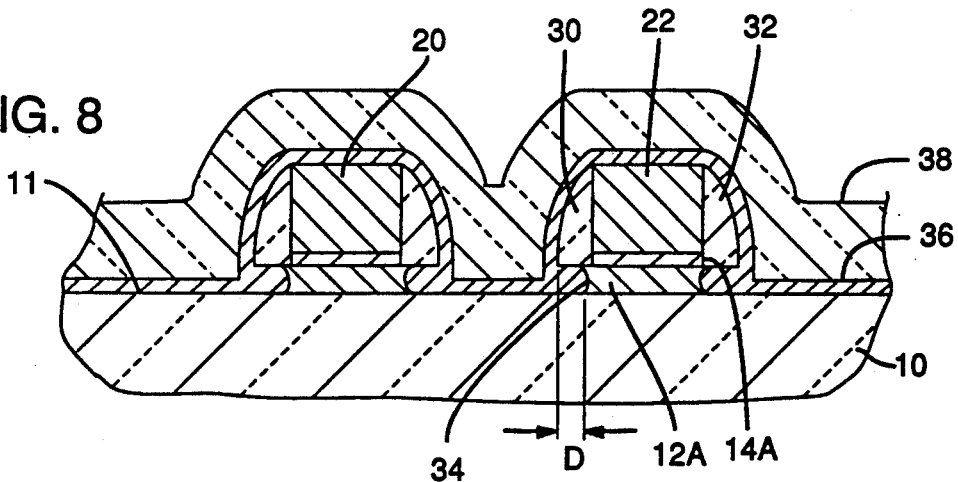
FIG. 8 is a view similar to FIG. 7 following deposition of dielectric layers over the metal lines and exposed areas of the substrate surface.

Subsequent dielectric layers 36, 38, such as silicon nitride and silicon dioxide, are deposited as shown in FIG. 8 to seal the tops of the metal lines. The presence of the spacers 30, 32 prevents the profile of the gold interconnect lines 20, 22 from deforming during the preheat portion of the deposition cycle. After this deposition, the metal lines are completely sealed by the dielectric layers 36 and 38, the barrier layer 12A and the two spacers 30, 32, and are thus prevented from interacting with the substrate.

For a completely isotropic etch of the barrier layer 12, that is, an etch which proceeds laterally at the same rate it proceeds vertically, the amount of undercut D will equal or slightly exceed the thickness of the barrier layer, assuming a slight overetch to assure complete removal of the barrier layer from the substrate surface 11. Preferably, the overetch is in the range of 20–25%. Thus, for a barrier thickness of about 1,500 angstroms, a sidewall lateral thickness of about 2,000 angstroms is sufficient to prevent undercutting of the metal lines 20, 22. This thickness is provided by depositing nitride layer 25 to a thickness of about 3,500 angstroms before anisotropic etching to form the sidewall spacers.

Having illustrated and described the principles of our invention in a preferred embodiment, it should be apparent to those skilled in the art that the invention may be modified in arrangement and detail without departing from such principles. Although the invention is preferably used in fabrication of high density, high speed bipolar integrated circuits, with gold as the preferred interconnect metal, it is applicable to any metallization process which utilizes a barrier metal and a different interconnect metal. For example, it can be used in metallization in silicon MOSFET and GaAs MESFET processes. We claim all the modifications and variations coming within the spirit and scope of the following claims.

We claim:

1. A metallization process for interconnecting integrated circuit elements on a substrate surface, the process comprising:
    forming a contiguous metal barrier layer on the substrate surface;
    forming and patterning discrete, spaced apart metal conductor lines on the barrier layer, the metal conductor lines being formed of a metal which is subject to deformation when heat treated;
    forming sidewall spacers on opposite sides of each of the metal conductor lines;
    selectively removing portions of the barrier layer exposed between the metal conductor lines so as to electrically isolate the metal conductor lines from one another, the sidewall spacers being sized to a thickness sufficient to prevent lateral undercutting of the metal conductor lines; and
    annealing the substrate after forming the metal conductor lines and sidewall spacers so that the sidewall spacers stabilize the sides of the metal conductor lines.

2. A process according to claim 7, wherein the metal conductor lines are formed of a metal which is subject to deformation when heat treated, the process further including the step of annealing the substrate after forming the metal conductor lines and sidewall spacers so that the sidewall spacers stabilize the sides of the metal conductor lines.

3. A process according to claim 1 in which the step of selectively removing portions of the barrier layer includes isotropically etching away at least the thickness of the barrier layer, the sidewall spacers having a thickness at least as great as the thickness of the barrier layer.

4. A process according to claim 7 in which the barrier layer comprises tungsten and the metal conductor lines comprise gold.

5. A process according to claim 4 in which the selective removing step includes wet etching the barrier layer after forming the sidewall spacers.

6. A metallization process for interconnecting integrated circuit elements on a substrate surface, the process comprising;
    forming a contiguous barrier metal layer on the substrate surface, said barrier layer consisting essentially of titanium tungsten (TiW);
    forming and patterning discrete, spaced apart gold conductor lines on the barrier layer;
    forming sidewall spacers on opposite sides of each of the gold conductor lines; and
    selectively removing portions of the barrier layer exposed between the gold conductor lines so as to electrically isolate the gold conductor lines from one another;
    the selective removal step including wet etching the barrier layer after forming the sidewall spacers, the sidewalls being sized to a thickness sufficient to prevent lateral undercutting of the gold conductor lines;
    the step of forming the gold conductor lines including depositing a plating layer comprising palladium onto the barrier layer, patterning and electroplating gold lines onto portions of the plating layer, and selectively removing remaining exposed portions of the plating layer prior to forming the sidewall spacers.

7. A metallization process for interconnecting integrated circuit elements on a substrate surface, the process comprising;
    forming a contiguous metal barrier layer on the substrte surface;
    forming and patterning discrete, spaced apart metal conductor lines on the barrier layer;
    forming sidewall spacers which comprise silicon nitride on opposite sides of each of the metal conductor lines; and
    selectively removing portions of the barrier layer exposed between the metal conductor lines so as to electrically isolate the metal conductor lines from one another;
    the sidewall spacers being sized to a thickness sufficient to prevent lateral undercutting of the metal conductor lines.

8. A metallization process for interconnecting integrated circuit elements on a substrate surface, the process comprising:
    forming a contiguous metal barrier layer on the substrate surface;
    forming and patterning discrete, spaced apart metal conductor lines on the barrier layer;
    forming sidewall spacers on opposite sides of each of the metal conductor lines;
    selectively removing portions of the barrier layer exposed between the metal conductor lines so as to electrically isolate the metal conductor lines from one another; and
    annealing the substrate after forming the metal conductor lines and sidewall spacers so that the sidewall spacers stabilize the sides of the metal conductor lines.

9. A process according to claim 8 in which the metal conductor lines are formed of a metal which is subject to deformation when heat treated.

10. A process according to claim 8 in which the metal lines comprise gold.

11. A method according to claim 8 in which the step of selectively removing portions of the barrier layer includes isotropically etching away at least the thickness of the barrier layer, the sidewall spacers having a thickness at least as great as the thickness of the barrier metal.

12. A process according to claim 8 in which the sidewalls are sized to a thickness sufficient to prevent lateral undercutting of the metal conductor lines.

13. A process according to claim 8 in which the sidewall spacers comprise silicon nitride.

14. A metallization process for interconnecting integrated circuit elements on a substrate surface, the process comprising:
   forming a contiguous metal barrier layer on the substrate surface, including a first layer of a predetermined thickness comprising titanium tungsten;
   patterning and additively forming discrete, spaced apart metal conductor lines of gold on the barrier layer;
   depositing a layer of a dielectric material over the substrate, including atop and along opposite sidewalls of the metal lines;
   anisotropically etching the dielectric layer to form sidewall spacers extending along the opposite sidewalls of each of the metal conductor lines and covering a margin of the barrier layer along each sidewall of the metal conductor lines;
   etching those portions of the barrier metal layer that are exposed between the metal conductor lines so as to electrically isolate the metal conductor lines from one another; and
   annealing the substrate after forming the metal conductor lines and sidewall spacers, the sidewall spacers stabilizing the sidewalls of the gold conductor lines against thermal deformation;
   the first layer being isotropically etched and the sidewall spacers being sized to a predetermined lateral thickness at least as great as the thickness of the first layer so as to prevent lateral undercutting of the metal conductor lines.

15. A process according to claim 14, including depositing a plating layer atop the barrier layer and etching the plating layer before the sidewall spacers are formed.

16. A process according to claim 15, in which the step of patterning and additively forming discrete, spaced apart metal conductor lines of gold includes depositing a layer of photoresist over the plating layer, patterning the photoresist to define openings in which selected areas of the plating layer are exposed, electroplating gold onto the exposed areas of the plating layer to form the metal lines, and removing the photoresist and underlying portions of the plating layer, the sidewall spacers being formed of a material which substantially retains the sidewalls of hold conductor lines in a profile determined by the openings in the photoresist.

17. A process according to claim 14 in which the sidewall spacers comprise silicon nitride.

18. A process according to claim 14 in which the step of selectively removing barrier metal includes overetching by a predetermined proportion of the thickness of the barrier metal, the sidewall spacers having a thickness at least as great as the thickness of the barrier metal plus the predetermined proportion of overetching.

* * * * *

UNITED STATES PATENT AND TRADEMARK OFFICE
CERTIFICATE OF CORRECTION

PATENT NO. : 5,145,571
DATED : September 8, 1992
INVENTOR(S) : Lane et al.

It is certified that error appears in the above-indentified patent and that said Letters Patent is hereby corrected as shown below:

Column 6        Line 37, change "substrte" to "substrate";

Column 8        Line 25, change "hold" to "gold".

Signed and Sealed this

Twenty-second Day of March, 1994

Attest:

BRUCE LEHMAN

Attesting Officer        Commissioner of Patents and Trademarks